United States Patent [19]

Hardin et al.

[11] Patent Number: 6,099,575
[45] Date of Patent: Aug. 8, 2000

[54] CONSTRAINT VALIDITY CHECKING

[75] Inventors: Ronald H. Hardin, Pataskala, Ohio;
Robert Paul Kurshan, New York, N.Y.

[73] Assignee: Lucent Technologies Inc., Murray Hill, N.J.

[21] Appl. No.: 09/102,850

[22] Filed: Jun. 23, 1998

[51] Int. Cl.[7] .............................. G06F 17/50; G06F 9/45; G06G 7/62

[52] U.S. Cl. .................. 703/22; 703/13; 703/17

[58] Field of Search ........................ 395/500.38, 500.34, 395/500.43; 703/13, 17, 22

[56] References Cited

U.S. PATENT DOCUMENTS

| 5,163,016 | 11/1992 | Har'El et al. ...................... 395/500.06 |
| 5,615,137 | 3/1997 | Holzmann et al. ................. 395/500.38 |
| 5,768,498 | 6/1998 | Boigelot et al. .......................... 714/39 |
| 5,901,073 | 5/1999 | Kurshan et al. ................... 395/500.27 |

OTHER PUBLICATIONS

R.P. Kurshan, *Computer Aided Verification Of Coordinating Process*, Princeton University Press 1994.

Primary Examiner—Kevin J. Teska
Assistant Examiner—Hugh Jones

[57] ABSTRACT

A method and apparatus for efficiently determining whether a set of constraints input to a verification tool are mutually contradictory or overconstraining. A set of constraints are mutually contradictory or overconstraining when they define values for system-model variables and/or inputs that are inconsistent with each other at a given state or group of states of a system-model state machine. It has been found that when a set of constraints assign inconsistent values at a given state or group of states of the system-model state space, the verification tool will treat the given state or group of states as a so-called non-returnable state. That is, the verification tool will not recognize any paths from the given state or group of states to a set of reset states. As a result, instead of having to analyze the values defined by every constraint input to the verification tool, it can be determined whether a set of constraints input to the verification tool are mutually contradictory or overconstraining by analyzing only the constraints enabled at the non-returnable states.

23 Claims, 2 Drawing Sheets

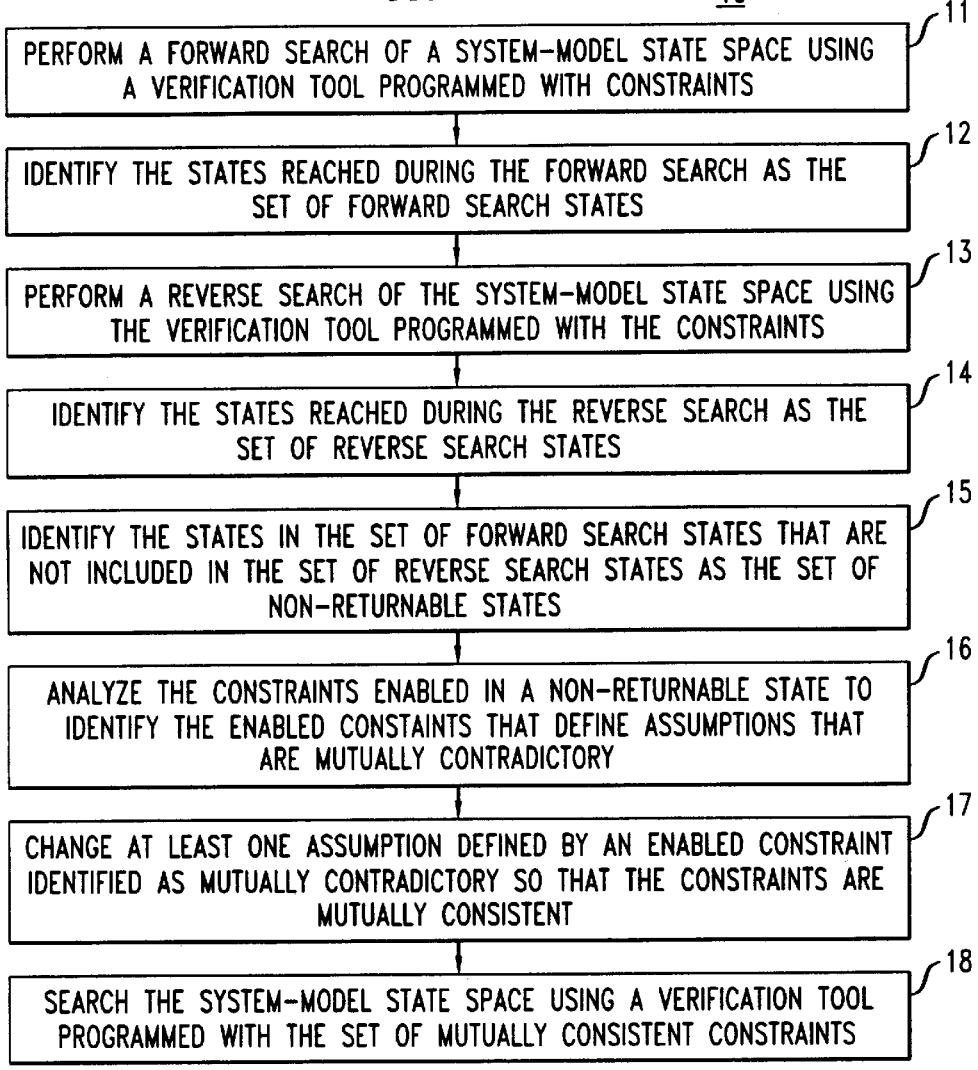
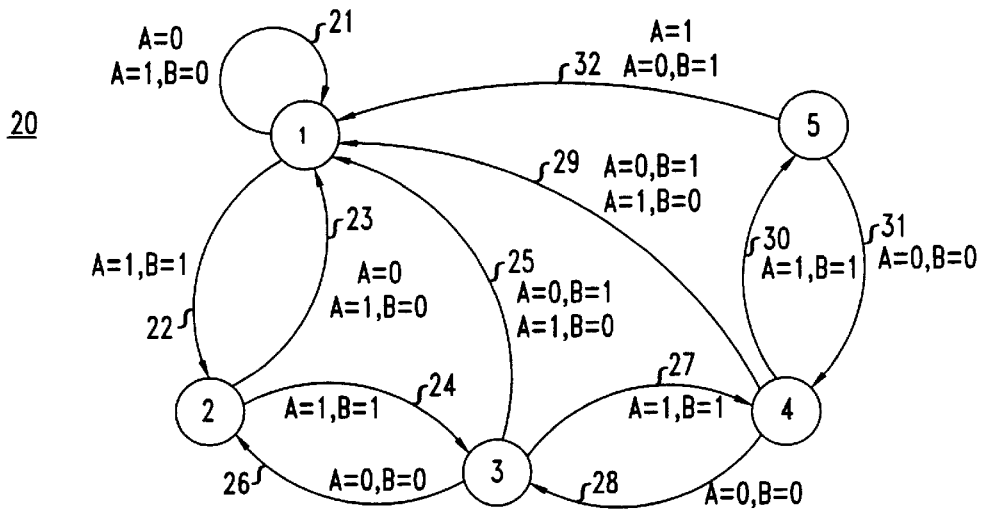

CONSTRAINT VALIDITY CHECKING

FIELD OF THE INVENTION

The present invention relates to the testing of system designs, and more particularly to an apparatus and method for checking the validity of constraints used during formal verification.

BACKGROUND OF THE INVENTION

An ongoing problem in the design of large systems is verifying that the system will behave in the manner intended by its designers. One approach has been to simply try out the system, either by building and testing the system itself or by building and testing a model of the system. Since there is no guarantee that an untested system will work as expected, building the system itself can be an expensive proposition. Thus, those skilled in the art have migrated toward building and testing a model of the system, or system model, through software.

A system model can be said to be a computer program or block of code that, when executed, simulates the intended properties, or functions, of the system. Basically, the system model is designed to accept inputs, perform functions and generate outputs in the same manner as would the actual system. To do this, the system model uses variables, called system-model variables, that are programmed within the code to take on certain values depending on the values of the inputs to the system model. That is, as different values are fed to the system-model inputs, the system-model variables are assigned different values that indicate how the system model functions or behaves in response to the inputs. Thus, by controlling the value of the inputs to the system model and monitoring the values of the system-model variables, a system designer can test or observe the behavior of the system model in response to different sets of inputs, and determine whether the system model exhibits, or performs, the intended behaviors or properties of the system.

One method of testing a system model in such a manner is called formal verification. In formal verification, a verification tool is used to convert the system model into a finite state machine. A finite state machine is a set of states and state transitions which minimic the operation of the system model in response to given sets of inputs, or input vectors. In general, each state of a finite state machine represents a specific assignment of values to a set of system-model variables and/or inputs, and thus represents a specific behavior or property of the system model. Each state transition defines the values that a set of system-model variables and/or inputs must take on for the state machine to transition from one state to another state. The state machine thereby provides a roadmap of how a system model will behave (i.e. the states the system model will enter) in response to the values input to the system-model inputs. As a result, once the verification tool converts the system model into such a finite state machine, the tool can test the properties or behaviors of the system model by checking which states the system-model state machine enters in response to a given set of inputs.

To illustrate, conventional verification tools, such as the verification tool described by R. P. Kurshan in *Computer Aided Verification of Coordinating Processes,* Princeton University Press 1994, are designed to test all the properties or behaviors of a system model by performing a so-called full search of the system-model state space (i.e. the set of states and state transitions that form the system-model state machine). Conventionally, the verification tool begins the full search by inputting a "complete set of inputs" at a set of initial states, or "set of reset states," of the system-model state machine. The term "complete set of inputs" as used herein refers to every possible set of values that the system-model inputs can possibly assume when the system model is in operation, in every possible sequence. The term "set of reset states" as used herein refers to those states from which the system model is designed to begin operation and/or return to after an operation is completed.

As the complete set of inputs are fed to the state machine at the set of reset states, the verification tool identifies the values that the system-model variables and/or inputs take on, and identifies the state transitions that are enabled by those values. Once the enabled state transitions are identified, the verification tool identifies the states, called "next states," to which the state machine can transition as a result of the inputs. Once the verification tool identifies all the next states that are reached as a result of the inputs, it continues the search by inputting the complete set of inputs at each of the next states and by identifying the new set of next states to which the state machine transitions as a result of the inputs. This process is repeated until the set of next states identified by the verification tool are all states that have already been reached (i.e. identified as next states) during the search. The set of states that are reached during the search are hereinafter referred to as the set of reachable states. By inputting the complete set of inputs at each state of the state machine, the set of reachable states is guaranteed to include every state of the system-model state space. As a result, the verification tool performing a full search is guaranteed to check every property or behavior of the system model.

In some instances, however, a system designer may wish to check only a portion of the properties or behaviors of a system model. For example, in some instances, the system designer may wish to check the system-model properties that conform with a subset of the inputs that may be possible during the operation of the system. In such instances, it is not necessary to search or reach all of the states of the system-model state machine, and thus it is not necessary to check the behavior of the system-model state machine in response to the complete set of inputs. Instead, the verification tool only needs to search or reach those states that represent the properties or behaviors the designer wishes to check, and thus only needs to check the behavior of the system-model state machine in response to a fraction of the complete set of inputs.

One method for directing the verification tool to check only a portion of the properties or behaviors of the system-model is to program the verification tool with so-called constraints. A constraint is a logical expression composed of an enabling condition and an assumption. The enabling condition defines the condition that must be true for the assumption to be invoked. The assumption defines the value or values that the verification tool shall assign to certain system-model variables and/or inputs when the enabling condition is true. An enabled constraint can therefore direct the verification tool to assign certain values to certain system-model variables and/or inputs, regardless of the values they are programmed to take on within the system-model.

When programmed with such a constraint, the verification tool will be directed to recognize only those state transitions that require the system-model variables and/or inputs to take on values that are consistent with the values defined by the constraints. As a result, the verification tool will only reach those states that represent an assignment of values (i.e.

values of the system-model variables and inputs) that are consistent with the values defined by the constraint. Thus, by carefully choosing the values which the constraint assigns to certain system-model variables and inputs, the verification tool can be directed to reach or search only those states that represent the properties or behaviors which the system-designer wishes to check.

For example, the constraint "IF(power-on)Assume(x=y)" will direct a verification tool to assume that the value of system-model variable x equals the value of system-model variable y when the enabling condition, power_on, is true. Once enabled, the constraint will direct the verification tool to only search or reach those states or state transitions where the inputs cause the value of system-model variable x to be equal to the value of system-model variable y. The constraint therefore defines a specific set of reachable states for the verification tool. Thus, if the specific set of reachable states includes all the states that represent the system-model property being checked, the constraint is said to properly limit the search.

Oftentimes, the system designer is required to program the verification tool with a plurality of constraints in order to properly limit the search. When programmed with a plurality of constraints, the verification tool will only search or reach the states that are consistent with every value defined by every constraint enabled in that state. Thus, it is important that the constraints enabled in each state assign values that properly define the set of reachable states.

A problem occurs, however, when the constraints enabled in a given state assign values that are inconsistent with each other. Such a set of enabled constraints are said to be mutually-contradictory at the given state. For example, the set of constraints:
Constraint1=IF(power-on)Assume (x=y); Constraint2= IF(temperature>30)Assume(y-z); and Constraint3=IF (time>1)Assume(x≠z); are mutually contradictory at any state in which all the enabling conditions are true at the same time. To illustrate, at a state wherein power_on, temperature>30, and time>1 are all true, Constraints 1–3 will direct the verification tool to assume x=y=z≠x, or x≠x, which is inconsistent, and thus mutually contradictory.

When a set of constraints are mutually contradictory (i.e. assign inconsistent values) at a given state of the search, the system-model variables and/or inputs can not take on a set of values that would be consistent with the values assigned by every enabled constraint at the same time. As a result, the verification tool performing the search will not recognize any state transition from that given state to any other state, no matter what inputs are fed to the state machine. This means that the verification tool will not reach or search any states beyond the given state in which the mutually contradictory constraints are enabled. As a result, the verification tool may fail to reach all the states associated with the system-model property or behavior being checked. When this happens the verification tool may not be able to identify all the errors associated with the property being checked. Thus, in order to check whether a verification tool's report of "no error" is accurate, the system designer should always check whether the set of constraints input to the verification tool are mutually contradictory.

A related and more subtle version of this problem occurs when the constraints, although not mutually contradictory at a single state, are inconsistent with each other in a group of states. A set of constraints are inconsistent in a group of states when the values assigned by constraints enabled in the group of states direct the verification tool to perpetually search only the states in the group. When this happens, the verification tool performing the search will not recognize any state transition from the group of states to any other state or group of states, no matter what inputs are fed to the state machine. This means that the verification tool will not reach or search any states beyond the given group of states in which the inconsistent constraints are enabled. As a result, the verification tool may fail to reach all the states associated with the system-model property or behavior being checked, and thus the verification tool may not be able to identify all the errors associated with the property being checked. When this happens, the constraints are said to "overconstrain" the search of the system-model state space. Thus, in addition to checking whether a set of constraints are mutually contradictory in a single state to determine whether a verification tool's report of "no error" is accurate, the system designer should also check whether the set of constraints assign inconsistent values in a group of states.

The conventional method for determining whether a set of constraints input to a verification tool are mutually contradictory at a single state or are inconsistent in a group of states is to analyze all the assumptions (i.e. value assignments) defined by all of the constraints. The object of such an analysis is to determine whether it is possible for the values assigned by one constraint to be inconsistent with the values assigned by another constraint at each state and each group of states. This requires that the values assigned by each constraint be analyzed for consistency with the values assigned by every other constraint at each state and each group of states of the state machine. Since some constraints may assign values as a function of other variables and/or inputs in each state, such an analysis requires a detailed understanding and/or determination of the mathematical relationship between the system-model variables and/or inputs, and an understanding or determination of the set of values that the system-model variables and/or inputs can assume in response to any given set of inputs at each state of the system-model state space. For systems having a large number of states and/or a large number of variables and inputs, such a task can be very time-consuming and can require a large amount of computational resources.

SUMMARY OF THE INVENTION

We have found an efficient method for determining whether a set of constraints are mutually contradictory. Instead of having to analyze the values assigned by every constraint input to the verification tool, we have found that only the set of constraints that are enabled in a so-called set of non-returnable states of the system-model state space need be analyzed. The term "set of non-returnable states" as used herein refers to a single state or a group of states in the system-model state space from which there is no path to the set of reset states when the system-model variables and/or inputs are assigned values in accordance with that defined by the constraints input to the verification tool.

Our finding is based on the realization that many systems are non-terminating. That is, many systems do not terminate their operation after performing a given function, but rather can return to an initial state or set of reset states from which they can then perform the same or another function. For example, after making a calculation, a calculator can return to zero (i.e. the reset state) when the "clear" button is pressed, and thereafter perform the same calculation or any other function of the calculator. In view of this, we realized that when a set of mutually contradictory or inconsistent constraints enabled in a given state or group of states direct a verification tool to ignore all state transitions from that given state or group of states, the set of mutually contradictory or inconsistent constraints will have caused the verification tool to treat the given state or group of states as a set of non-returnable states. As a result, we realized that by identifying a state or group of states which a verification tool, programmed with a set of constraints, treats as non-returnable, one will have identified a state or group of states in which the set of constraints may have assigned inconsistent values. Thus, we have found that by analyzing the values assigned by the constraints enabled in an identified non-returnable state or non-returnable group of states, it can be determined whether the set of constraints input to the verification tool are mutually contradictory or overconstraining.

In particular embodiments, the set of non-returnable states or group of states are identified by first performing a so-called forward search wherein the verification tool programmed with the set of constraints starts at the set of reset states of the system-model state machine and identifies all the states and group of states that it can possibly reach by inputting the complete set of inputs at each state. Each state and each group of states identified during the forward search are referred to herein as the forward search states. Once the forward search states are identified, the verification tool then performs a so-called reverse search wherein it identifies all the states and group of states from which it can reach the set of reset states by inputting the complete set of inputs at each state. Each state and each group of states identified during the reverse search are referred to herein as the reverse search states. Each state included in the set of forward search states that is not included in the set of reverse search states is then identified as a non-returnable state. Since the set of forward search states and the set of reverse search states include both individual states and groups of states, it can be appreciated that the term non-returnable state as used herein refers to both individual states and groups of states from which there is no return path to the set of reset states. The values assigned by the constraints enabled in the identified non-returnable states are then analyzed to determine whether they assign values that are inconsistent with each other. The constraints that assign values that are inconsistent with each other in a single state are identified as mutually contradictory constraints, and the constraints that assign values that are inconsistent with each other in a group of states are identified as a set of overconstraining constraints. Thus, constraints that are neither mutually contradictory nor overconstraining are referred to herein as mutually consistent constraints.

Advantageously, once a set of mutually-contradictory constraints and/or a set of overconstraining constraints are identified, a system-designer can adjust and/or eliminate the inconsistent value-assignments defined by the contradictory and/or overconstraining constraints, and thereby increase the probability that a verification tool, programmed with the set of adjusted or mutually consistent constraints, will accurately check the entire portion of the state space representing the properties or behaviors that the system-designer wishes to check.

These and other features of the invention will become more apparent from the detailed description of illustrative embodiments of the invention when taken with the drawings. The scope of the invention, however, is limited only by the claims.

BRIEF DESCRIPTION OF THE DRAWINGS

FIG. 1. is a block diagram of an illustrative embodiment of a method for performing a search of a system-model state space using a verification tool programmed with a set of mutually-consistent constraints developed in accordance with the principles of the present invention.

FIG. 2 is a diagram of a system-model state space for illustrating an application of the method of FIG. 1.

DETAILED DESCRIPTION OF ILLUSTRATIVE EMBODIMENTS OF THE INVENTION

Figure 3:
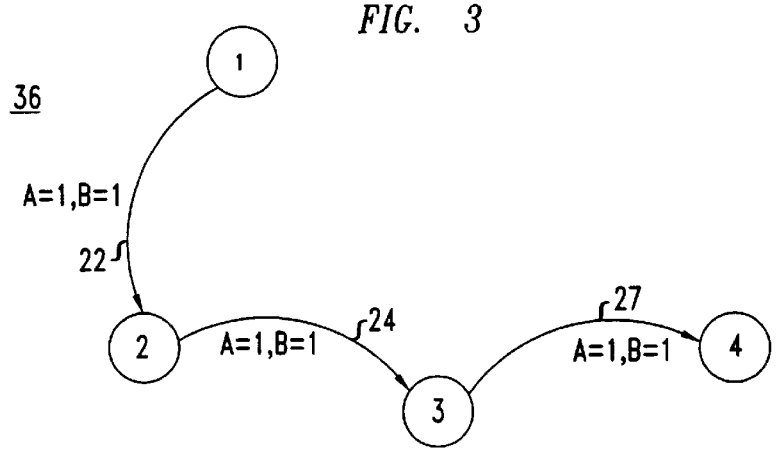
FIG. 3 is a diagram of the forward search states reached when a verification tool, programmed with a set of constraints, performs a forward search of the system-model state space shown in FIG. 2 in accordance with the method shown in FIG. 1.

As stated above, one method for directing a verification tool to check only a portion of the properties or behaviors of a system-model is to program the verification tool with so-called constraints. A constraint is a logical expression composed of an enabling condition and an assumption. The enabling condition defines the condition that must be true for the assumption to be invoked. The assumption defines the value or values that the verification tool shall assign to certain system-model variables and/or inputs when the enabling condition is true. An enabled constraint can therefore direct the verification tool to assign certain values to certain system-model variables and/or inputs, regardless of the values they are programmed to take on within the system-model.

When programmed with such a constraint, the verification tool will be directed to recognize only those state transitions that require the system-model variables and/or inputs to take on values that are consistent with the values defined by the constraints. As a result, the verification tool will only reach those states or groups of states that represent an assignment of values (i.e. values of the system-model variables and inputs) that are consistent with the values defined by the constraint. Thus, by carefully choosing the values which the constraint assigns to certain system-model variables and inputs, the verification tool can be directed to reach or search only those states that represent the properties or behaviors which the system-designer wishes to check.

Oftentimes, the system designer is required to program the verification tool with a plurality of constraints in order to properly limit the search. When programmed with a plurality of constraints, the verification tool will only recognize a state transition from a given state to another state when the state transition defines a value assignment that is consistent with every value defined by every constraint enabled in that state. Thus, it is important that the constraints enabled in each state assign values that properly define the set of reachable states. A problem occurs, however, when the constraints enabled in a given state or a given group of states assign values that are inconsistent with each other. Such a set of enabled constraints are said to be mutually-contradictory or overconstraining at the given state or group of states.

When a set of constraints are mutually contradictory (i.e. assign inconsistent values) at a given state of the search, the system-model variables and/or inputs can not take on a set of values that would be consistent with the values assigned by every enabled constraint at the same time. As a result, the verification tool performing the search will not recognize any state transition from that given state to any other state, no matter what inputs are fed to the state machine. This means that the verification tool will not reach or search any states beyond the given state in which the mutually contradictory constraints are enabled. As a result, the verification tool may fail to reach all the states associated with the system-model property or behavior being checked. When this happens the verification tool may not be able to identify all the errors associated with the property being checked. Thus, in order to check whether a verification tool's report of "no error" is accurate, the system designer should always check whether the set of constraints input to the verification tool are mutually contradictory.

Similarly, when a set of constraints are inconsistent with each other in a given group of states, the system-model variables and/or inputs can not take on a set of values that would enable the verification tool to transition out of the group of states to any other state, no matter what inputs are fed to the state machine during the search. As a result, a set of overconstraining constraints may prevent the verification tool from reaching all the states associated with the system-model property or behavior being checked. When this happens, the verification tool may not be able to identify all the errors associated with the property being checked. Thus, in addition to checking whether a set of constraints are overconstraining in order to determine whether a verification tool's report of "no error" is accurate, a system designer should also check whether the set of constraints input to the verification tool are overconstraining.

As states above, the conventional method for determining whether a set of constraints input to a verification tool are mutually contradictory or overconstraining is to analyze all the assumptions (i.e. value assignments) defined by all of the constraints. The object of such an analysis is to determine whether it is possible for the values assigned by one constraint to be inconsistent with the values assigned by another constraint. This requires that the values assigned by each constraint be analyzed for consistency with the values assigned by every other constraint at each state and each group of states of the state machine. Since some constraints may assign values as a function of other variables and/or inputs in each state, such an analysis requires a detailed understanding and/or determination of the mathematical relationship between the system-model variables and/or inputs, and an understanding or determination of the set of values that the system-model variables and/or inputs can assume in response to any given set of inputs at each state of the system-model state space. For systems having a large number of states and/or a large number of variables and inputs, such a task can be very time-consuming and can require a large amount of computational resources.

The present invention provides a means for reducing the time and/or computational resources needed to determine whether a set of constraints are mutually contradictory or overconstraining. Instead of analyzing the assumptions or value-assignments defined by every constraint input to the verification tool, a method in accordance with the principles of the present invention requires that only the values assigned by the constraints enabled in a so-called set of non-returnable states of the system-model state space need be analyzed. As stated above, the term "set of non-returnable states" as used herein refers to both individual states and groups of states in the system-model state space from which there is no path to the set of reset states when the system-model variables and/or inputs are assigned values in accordance with that defined by the constraints input to the verification tool.

As stated above, our finding is based on the realization that many systems are non-terminating. That is, many systems do not terminate their operation after performing a given function, but rather can return to an initial state or set of reset states from which they can then perform the same or another function. In view of this, we realized that when a set of mutually contradictory constraints or a set of overconstraining constraints enabled in a given state or group of states direct a verification tool to ignore all state transitions from that given state or group of states, the set of mutually contradictory constraints or overconstraining constraints will have caused the verification tool to treat or recognize the given state or group of states as a non-returnable state. As a result, we realized that by identifying the states which a verification tool, programmed with a set of constraints, treats or recognizes as non-returnable, one will have identified the individual states and groups of states in which the set of constraints may have assigned inconsistent values. Thus, we have found that by analyzing the values assigned by the constraints enabled in a non-returnable state (i.e. individual states and groups of states from which the verification tool does not recognize a path to the set of reset states), it can be determined whether the set of constraints input to the verification tool are mutually contradictory or overconstraining.

Once identified, the mutually contradictory or overconstraining constraints can be re-defined so that their assumptions do not assign values that are inconsistent with each other at any state or group of states during a search of the system-model sate space. The result is a set of mutually consistent constraints which can be used by the verification tool (i.e. to perform a search) to verify the system-model properties or behaviors which a designer wishes to check.

Referring now to FIG. 1, there is shown an illustrative embodiment of a method 10 for performing a search of a system-model state space using a verification tool programmed with a set of mutually-consistent constraints developed in accordance with the principles of the present invention. As shown, method 10 begins at step 11 wherein a verification tool programmed with test constraints is used to perform a forward search of a system-model state space. The states and groups of states reached during the forward search are identified, at step 12, as forward search states. The verification tool programmed with the set of test constraints is then used, at step 13, to perform a reverse search of the system-model state space. The states and groups of states reached during the reverse search are identified, at step 14, as reverse search states. At step 15 the states included in the set of forward search states that are not included in the set of reverse search states are identified as non-returnable states. The constraints enabled in a given non-returnable state (i.e. either an individual state or a group of states) are analyzed, at step 16, to determine which of the enabled constraints defines assumptions or values-assignments that are inconsistent with each other. The enabled constraints that define inconsistent value assignments are then re-defined, at step 17, so that they no-longer define inconsistent value assignments and such that the set of test constraints are no-longer mutually contradictory or overconstraining, i.e. they are mutually consistent. A verification tool programmed with the set of mutually consistent constraints is then used, at step 18, to search the system-model state space in a conventional manner.

Advantageously, method 10 enables a system designer to make sure that the constraints used to test given properties and/or behaviors of a system model are mutually consistent, and thus increase the probability that a verification tool programmed with the set of mutually-consistent constraints will check the entire portion of the state space representing the properties or behaviors that the system-designer wishes to check. As a result, method 10 provides a means for testing properties of a system model with less probability that the constraints programmed into the verification tool will cause the verification tool to miss an error in a portion of the system-model state space representing the behavior or property the designer wishes to check.

Referring now to FIG. 2 there is shown a diagram of a system-model state space or state machine 20 for illustrating how a conventional verification tool, programmed with a set of constraints, will perform steps 11–18 of method 10. As shown, state machine 20 has a set of reset states 1, states 2–5, state transitions 21–32, and system-model inputs A and B. It should be pointed out that even though states 2–5 are shown as individual states in FIG. 1, each state is intended to represent both an individual state or a group of states. Thus, the following discussion of how a verification tool programmed with a set of constraints will perform steps 11–18 of method 10 is intended to illustrate, for example, how both individual states and groups of states may be identified as non-returnable states in accordance with the principles of the present invention In operation, starting in set of reset states 1, state machine 20 will transition to state 2 when system-model inputs A and B each take on a value of 1. When in state 2, state machine 20 will transition to state 3 when system-model inputs A and B each take on a value of 1, and transition to set of reset states 1 either when system model input A takes on a value of or when system model input A takes on a value of 1 and system model variable B takes on a value of 0. When in state 3, state machine 20 will transition to state 4 when system-model inputs A and B each take on a value of 1, transition to state 2 when system-model inputs A and B each take on a value of 0, and transition to set of reset states 1 either when system-model input A takes on a value of I and system-model input B takes on a value of 0 or when system-model input A takes on a value of 0 and system-model input B takes on a value of 1. When in state 4, state machine 20 will transition to state 5 when system-model inputs A and B each take on a value of 1, transition to state 3 when system-model inputs A and B each take on a value of 0, and transition to set of reset states 1 either when system-model input A takes on a value of 0 and system-model input B takes on a value of 1 or when system-model input A takes on a value of 1 and system-model input B takes on a value of 0. When in state 5, state machine 20 transitions to state 4 when system-model inputs A and B each take on a value of 0, and transitions to set of reset states 1 either when system-model input A takes on a value of 1 or when system-model input A takes on a value of 0 and system-model input B takes on a value of 1.

To illustrate how a search of state machine 20 is performed in accordance with the steps of method 10, it is assumed that the verification tool is programmed with the following constraints:

Constraint1=IF(state=3)ASSUME(A=B)
Constraint2=IF(state=4)ASSUME(A=0)
Constraint3=IF(state=4)ASSUME(B=0)
Constraint4=IF(state=4)ASSUME(A≠B)

As described above, a forward search is a search wherein the verification tool, programmed with the set of constraints, starts at a set of reset states of the system-model state machine and identifies all the states that it can possibly reach by inputting the complete set of inputs at each state. Referring now to FIG. 3 there is shown a state space 36 illustrating the states reached when a conventional verification tool programmed with the above-listed constraints performs a forward search of state machine 20 in accordance with step 11 of method 10. To illustrate, in performing the forward search of state machine 20, the verification tool will start at set of reset states 1, input a complete set of inputs to system-model inputs A and B, and identify the set of next states to which state machine 20 can transition given the set of constraints. Since none of the above-listed constraints are enabled in set of reset states 1, the verification tool will identify state 2 as the set of states to which state machine 20 can transition (i.e. when system-model inputs A and B each take on a value of 1). As a result, the verification tool will recognize or allow state transition 22 so that machine 20 transitions to next state 2.

When in state 2, the verification tool will again input the complete set of inputs to state machine 20 and identify set of reset states 1 (i.e. when system-model inputs A and B each take on a value of 0) and state 3 (i.e. when system-model inputs A and B each take on a value of 1) as the set of next states. Since the verification tool has already reached or searched set of reset states 1, the verification tool will recognize and allow state transition 24 so that state machine 20 transitions to state 3.

When in state 3, the verification tool will again input the complete set of inputs to state machine 20 and identify set of reset states 1 (i.e. when system-model input A=1 and B=0, or when A=0 and B=1), state 2 (i.e. when system-model inputs A and B each take on a value of 0) and state 4 (i.e. when system-model inputs A and B each take on a value of 1) as the set of next states. Since Constraint1 directs the verification tool to assume that system-model input A equals system-model input B when in state 3, the verification tool will be directed to ignore state transition 25. And, since state 2 has already been reached or searched, the verification tool will only recognize and allow state transition 27 so that state machine 20 transitions to state 4.

When in state 4, the verification tool will again input the complete set of inputs to state machine 20 and identify set of reset states 1 (i.e. when system-model input A=1 and B=0, or when A=0 and B=1), state 3 (i.e. when system-model inputs A and B each take on a value of 0) and state 5 (i.e. when system-model inputs A and B each take on a value of 1) as the set of next states. Since, however, Constraint2 and Constraint3 direct the verification tool to assume that system-model input A and system-model input B be assigned a value of 0 (i.e. they are equal in value) and Constraint4 directs the verification tool to assume that system-model inputs A and B are not equal in value, the verification tool will not recognize any state transition in which all the constraints are satisfied. That is, the constraints will direct the verification tool to assume values for system-model inputs A and B that are inconsistent with each other. As a result, the verification tool will not recognize any state transition from state 4. Thus, the forward search performed in accordance with step 11 of method 10 would not reach state 5 of state machine 20. Moreover, as shown in FIG. 3, the set of forward search states that would be identified in step 12 of method 10 includes only set of reset states 1 and states 2–4.

Figure 4:
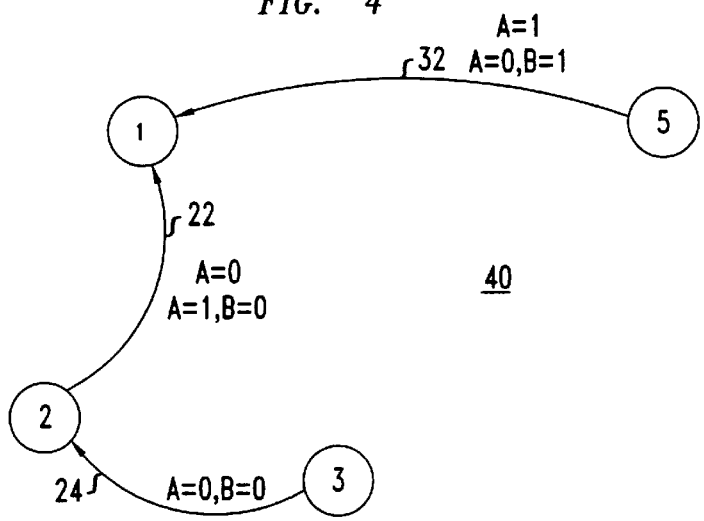
FIG. 4 is a diagram of the reverse search states reached when a verification tool, programmed with a set of constraints, performs a reverse search of the system-model state space shown in FIG. 2 in accordance with the method shown in FIG. 1.

The same verification tool programmed with the above-listed constraints can perform a reverse search of state machine 20 by identifying the states from which the verification tool programmed with the above-listed constraints can reach or recognize a path through state machine 20 to set of reset states 1. Referring now to FIG. 4 there is shown a state space 40 illustrating the states reached when a conventional verification tool programmed with the above-listed constraints performs a reverse search of state machine 20 in accordance with step 13 of method 10. To illustrate, in performing the reverse search of state machine 20, the verification tool will first identify each state having a direct state transition to set of reset states 1 (i.e. direct-transition states 2–5), input a complete set of inputs to system-model inputs A and B at each direct-transition state, and determine whether state machine 20 has a path from the direct-transition states to set of reset states 1, given the set of constraints. Since Constraint1 directs the verification tool to assume system-model input A equals system-model input B in state 3, the verification tool will not recognize state transition 25 of state machine 20. In addition, since Constraints 2–4 direct the verification tool to assign inconsistent values to system-model inputs A and B (i.e. A=0=B≠A, or A≠A), the verification tool will not recognize state transition 29 of state machine 20. As a result, the verification tool will only recognize state transitions 22 and 32, and thus will only identify states 2 and 5 as having a direct path to set of reset states 1.

To continue the reverse search, the verification tool will then identify those states having a direct state transition to states 2 and 5 (i.e. indirect-transition states 3 and 4), input a complete set of inputs to system-model inputs A and B at the identified indirect transition states, and determine whether state machine 20 recognizes a path from the identified indirect-transition states to states 2 and/or 5. To illustrate, the verification tool will identify states 3 and 4 as having a direct transition to states 2 and 5, respectively. When in state 3, Constraint1 will direct the verification tool to assume system-model input A equals system-model input B. Since state transition 26 only requires that system-model inputs A and B each take on a value of 0 (i.e. they are equal), the verification tool will identify state 3 as having a direct path to state 2, and thus a path in state machine 20 to set of reset states 1. When in state 4, however, Constraints 2–4 will direct the verification tool to assign inconsistent values to system-model inputs A and B (i.e. A=0=B≠A, or A≠A). As a result, the verification tool will not recognize state transition 30 which connects state 4 to state 5 in state machine 20. Thus, the verification tool will not recognize and path from state 4 to set of reset states 1. Consequently, as shown in FIG. 4, the set of reverse search states that would be identified in step 14 of method 10 would include only set of reset states 1 and states 2, 3 and 5.

In accordance with step 15 of method 10, the set of non-returnable states of state machine 20 is determined by identifying the states or group of states in the set of forward search states that are not included in the set of reverse search states. Since the set of forward search states includes set of reset states 1 and states 2–4, and the set of reverse search states includes set of reset states 1 and states 2, 3 and 5, the set of non-returnable states in state machine 20 includes only state 4.

Once state 4 is identified as a non-returnable state, the constraints enabled in state 4 (i.e. constraints 2–4 ), or the constraints enabled in the group of states represented by state 4, are analyzed in accordance with step 16 of method 10 to determine whether they define value-assignments that are inconsistent with each other. Since Constraint2 and Constraint3 direct the verification tool to assume that both system-model input A and system-model input B have a value of 0 (i.e. they are equal), and Constraint4 directs the verification tool to assume that system-model input A does not equal system-model input B, constraints 2–4 will be identified in step 16 of method 10 as defining assumptions that are mutually contradictory, or overconstraining in the case of state 4 representing a group of states.

Depending on which properties or states the system designer wishes to check, the assumptions defined by any one or combination of mutually-contradictory or overconstraining constraints 2–4 are changed in accordance with step 17 of method 10, so that the constraints are mutually consistent. For example, if in a particular embodiment the system designer wishes to search only states 104 of state machine 20, constraint4 can be changed to direct the verification tool to assume that system-model variable A equals system-model variable B. To illustrate constraint 4 can be changed to the expression "IF(state=4)ASSUME(A=B)." Such a change to constraint4 would transform constraints1–4 into a set of mutually consistent constraints.

If a verification tool, programmed with the set of mutually consistent constraints, performs a search of the state machine 20 in accordance with step 18 of method 20, the verification tool will recognize every state transition except state transition 30 which defines the conditions for state machine 20 to transition from state 4 to state 5. Thus, the set of mutually consistent constraints will direct the verification tool to only check or search the behaviors represented by states 1–4, as desired by the system-designer.

Figure 5:
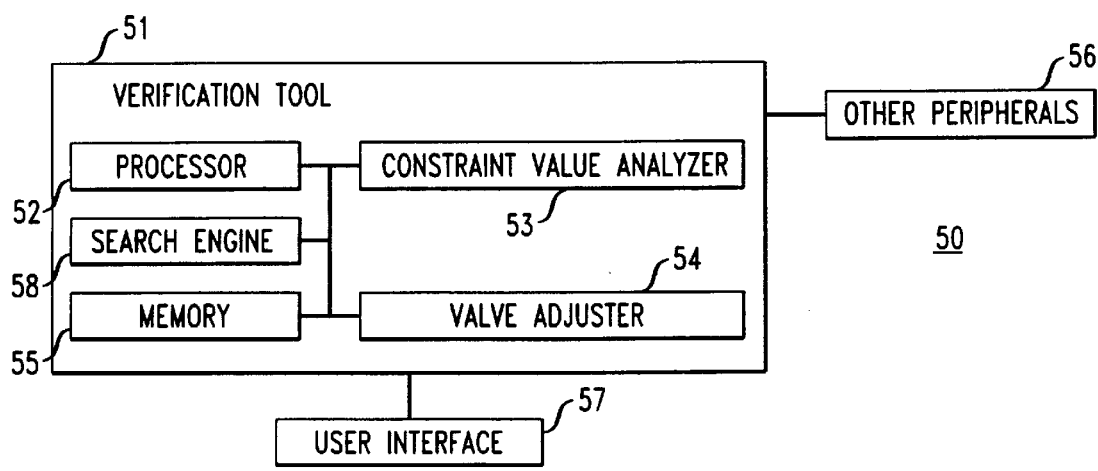
FIG. 5 is a block diagram of an illustrative embodiment of a verification tool for performing a search in accordance with the method shown in FIG. 1.

Referring now to FIG. 5, there is shown an illustrative embodiment of an apparatus 50 for performing a search in accordance with method 10 of FIG. 1. As shown, apparatus 50 has a verification tool 51 including a processor 52, a search engine 58, a memory 55, a constraint-value analyzer 53 and a value adjuster 54. Verification tool 51 is connected to a user interface 57 and other peripherals 56.

Verification tool 51 is operable to use search engine 58, processor 52 and memory 55 to perform a search of a system-model state machine in a conventional manner. That is, search engine 58 is operable to feed inputs to the system-model inputs and monitor the behavior of the state machine in response to those inputs in a conventional manner. Processor 52 is operable to perform calculations and other functions required by search engine 58 to perform the search. Memory 55 is a conventional random access memory (RAM) operable to store the values input by the search engine to the system-model inputs and store the corresponding values assumed by system-model variables and/or inputs as a result of the inputs.

Verification tool 51 is also operable to use constraint-value analyzer 53 to compare the values assigned by each constraint enabled in a given non-returnable state and identify the constraints that define value-assignments that are inconsistent with each other (i.e. mutually contradictory or overconstraining). In particular embodiments constraint-value analyzer 53 is a computer program accessible to processor 52.

Verification tool 51 is further operable to use value adjuster 54 to change the values assigned by mutually-contradictory or overconstraining constraints so that their value-assignments are mutually consistent. In particular embodiments, value adjuster 54 is a computer program accessible to processor 52.

Other peripherals 56 includes, for example, a printer for printing out the values stored in memory 55, and a modem for connecting verification tool 51 to, for example, a database in which verification tool 51 can store the results of a search by search engine 58. User interface 57 includes, for example, a conventional keyboard and a display to enable a programmer to, for example, control the operation of verification tool 51 and input constraints to memory 55.

When performing the steps of method 10 shown in FIG. 1, verification tool 51 uses search engine 58 to perform both a forward search and a reverse search of a system-model state space to identify a set of forward search states and a set of reverse search states, as described above. Processor 52 is then used to identify a set of non-returnable states as the states or groups of states included in the set of forward search states that are not included in the set of reverse search states. Once the set of non-returnable states is identified, processor 52 identifies the constraints enabled in a given non-returnable state (i.e. an individual state or a group of states that is identified as non-returnable) and feeds the enabled constraints to constraint value analyzer 53 which identifies the constraints that define inconsistent value-assignments as either mutually-contradictory constraints in the case of the given non-returnable state being an individual state, or as overconstraining constraints in the case of the given non-returnable state being a group of states. The mutually-contradictory constraints or overconstraining constraints are fed to value adjuster 54 which adjusts at least one of the constraints so that they assign values that are consistent with each other, or mutually consistent. The mutually consistent constraints are then fed back to search engine 58 which performs a search of the system-model state space. The results of the search can then be printed out through other peripherals 56, stored in memory 55 and/or displayed through user interface 57.

For clarity of explanation, the embodiments of the present invention shown in FIGS. 1 and 5 and described above is merely illustrative. Thus, for example, it will be appreciated by those skilled in the art that the block diagram shown and described in FIG. 5 herein represents a conceptual view of illustrative circuitry embodying an apparatus for performing a search in accordance with the principles of the invention. Similarly, it will be appreciated by those skilled in the art that the block diagram shown and described in FIG. 1 herein represents a conceptual view of illustrative steps embodying a method for performing a search of a system-model state space with a set of mutually consistent constraints developed in accordance with the principles of the invention.

In the claims hereof any element expressed as a means for performing a specified function is intended to encompass any way of performing that function including, for example, a) a combination of circuit elements which performs that function or b) software in any form (including, therefore, firmware, microcode or the like) combined with appropriate circuitry for executing the software to perform the function. The invention defined by such claims resides in the fact that the functionalities provided by the various recited means are combined and brought together in the manner in which the claims call for. Applicant thus regards any means which can provide those functionalities as equivalent as those shown herein.

It will be appreciated by those skilled in the art that they will be able to devise various arrangements which, though not explicitly shown or described herein, embody the principles of the present invention and thus are within its spirit and scope.

We claim:

1. A method carried out on a computer of verifying properties of a system, the method comprising the steps of:

applying to said system input signals that are subject to imposed constraints, using a verification tool, identifying states of said system that are non-returnable states, and when said step of using a verification tool determines that there exist non-returnable states in said system, outputting an alert signal that informs an operator that said imposed constraints are mutually inconsistent or that there is a design error in said system, and conversely, when said step of using said verification tool determines that said imposed constraints are mutually consistent and no error determinations are made in the course of said applying said input signals, outputting a signal to said operator that indicates consistency of said properties.

2. A method carried out in a computer, for verifying properties of a system comprising the steps of:

using a verification tool imposing a set of constraints on said system, that constrain input signals applied to said system and/or internal signals of said system, and performing a forward search beginning from a designated set of reset states to identify a set of reachable states, said set of forward search states being states that said system reaches by inputting at each state of said system a complete set of inputs, subject to said constraints;

using said verification tool, imposing said set of constraints on said system and performing a reverse search beginning from a designated set of reset states, by identifying states of said system from which said verification tool can reach a set of reset states by inputting at each state said complete constrained set of inputs, subject to said constraints, thereby identifying a set of reverse search states;

identifying a set of non-returnable reachable states of said system, said set of non-returnable reachable states being the difference between the set of forward search states and the set of reverse search states; and analyzing said non-returnable reachable states to identify mutually inconsistent constraints or over-constraining constraints in said set of constraints, to identify constraint restrictions that, when modified, reduce or eliminate said set of non-returnable search states.

3. The method of claim 2 further comprising the step of identifying constraints enabled in a non-returnable state, that reflect assumptions that are inconsistent with each other, and changing those assumptions to eliminate inconsistencies, thereby converting said mutually inconsistent constraints into mutually consistent constraints.

4. The method of claim 1 wherein said system is embodied in software controlled processor.

5. A method carried out in a computer comprising the steps of:

applying input signals to a system, to identify a set of non-returnable reachable states of said system said set of non-returnable reachable states being states in which a verification tool, programmed with a set of constraints, recognizes no path to a set of reset states, said set of reset states being states in the system model state space states from which the system model is designed to begin operation and return to when the system is reset; and analyzing the constraints enabled in said set of non-returnable states to determine whether said set of constraints programmed in said verification tool are inconsistent with each other.

6. The method of claim 5 wherein said step of identifying comprises the steps of:

using said verification tool programmed with said constrains, performing a forward search of said system-model state space to identify a set of forward search states, said set of forward search states being the states that said verification tool reaches from a designated set of reset states by inputting a complete set of inputs at each state of said system; and using said verification tool programmed with said constraints, performing a reverse search of the system-model state space from a designated set of reset states to identify a set of reverse search states, said set of reverse search states being the states from which said verification tool reaches the set of reset states by inputting said complete set of inputs at each state;

said non-returnable states being the difference between said set of forward search states and said set of reverse search states.

7. The method of claim 5 wherein said step of analyzing comprises the step of comparing values allowed by constraints enabled in said non-returnable states to determine whether the values are consistent with each other.

8. The method of claim 7 further comprising the step of:

identifying a smallest set of constraints that require inconsistent values in a non-returnable state as a set of inconsistent constraints.

9. The method of claim 8 further comprising the step of:

adjusting values allowed by said set of inconsistent constraints so that said set of constraints are mutually consistent.

10. An apparatus comprising:

a means for developing a set of mutually-consistent constraints by analyzing assumptions defined by constraints enabled in a non-returnable state of a state space representing the behavior of the system model, said non-returnable state being a state from which there is no path through the state space to a set of reset states; and a verification tool programmed with said set of mutually consistent constraints.

11. The apparatus of claim 10 wherein said verification tool comprises a processor coupled to a search engine, a memory, a constraint-value analyzer and a value adjuster.

12. The apparatus of claim 11 further comprising a user interface coupled to said verification tool, said user interface including a computer keyboard and a display which enable a programmer to control an operation of the verification tool.

13. The apparatus of claim 12 further comprising peripheral devices including a printer and a modem, said printer and said modem being connected to said verification tool.

14. The apparatus of claim 13 wherein said verification tool is operable to perform a forward search of said system-model state space to identify a set of forward search states, said set of forward search states being the states that said verification tool reaches by inputting a complete set of inputs at each state.

15. The apparatus of claim 14 wherein said verification tool is further operable to perform a reverse search of said system-model state space to identify a set of reverse search states, said set of forward search states being the states that said verification tool reaches by inputting a complete set of inputs at each state, said non-returnable states thereby being the difference between the set of forward search states and the set of reverse search states.

16. The apparatus of claim 15 wherein said constraint-value analyzer comprises means for determining whether constraints enabled in a non-returnable state define values that are inconsistent with each other, said constraints that define inconsistent values being inconsistent constraints.

17. The apparatus of claim 16 wherein said value adjuster comprises means for adjusting values assigned by said inconsistent constraints to obtain the set of mutually consistent constraints.

18. A method for determining whether constraints input to a verification tool are mutually contradictory, the method comprising the step of:

determining whether, during a search performed by the verification tool, a set of values assigned by a set of constraints enabled in some state of a system-model state space results in a non-null set of non-returnable states of said system-model, said non-returnable state being a state in which the verification tool recognizes no path to a set of reset states, said set of reset states being states in the system model state space states from which the system model is designed to begin operation and to which the system model is designed to return when the system is reset; and concluding that said constraints are mutually contradictory when said set of non-returnable states of said system-model is non-null.

19. The method of claim 18 wherein said step of determining comprises the steps of:

using said verification tool programmed with said constraints, performing a forward search of said system-model state space to identify a set of forward search states, said set of forward search states being the states that said verification tool reaches by inputting a complete set of inputs at each state; and using said verification tool programmed with said constraints, performing a reverse search of the system-model state space to identify a set of reverse search states, said set of reverse search states being the states from which said verification tool reaches the set of reset states by inputting said complete set of inputs at each state;

said non-returnable states being the difference between said set of forward search states and said set of reverse search states.

20. The method of claim 19 further comprising the step of:

identifying constraints that assign inconsistent values in a non-returnable state as a set of mutually-contradictory constraints.

21. The method of claim 20 further comprising the step of:

adjusting said inconsistent values to convert said mutually contradictory constraints to mutually consistent constraints.

22. A method of verifying properties of a system, the method comprising the step of employing a verification tool that constrains applied signals to said system and/or internal signals of said system pursuant to specified constraints, which constraints are developed by redefining assumptions defined by test constraints enabled in a non-returnable state of said system, said non-returnable state being a state from which there is no path through to a set of reset states when a verification tool programmed with said test constraints searches said non-returnable state.

23. The method of claim 8 where said identifying the smallest set of constraints is performed with a binary search.

* * * * *